United States Patent
Kurachi et al.

(10) Patent No.: US 10,418,985 B2
(45) Date of Patent: Sep. 17, 2019

(54) RADIATION-DAMAGE-COMPENSATION-CIRCUIT AND SOI-MOSFET

(71) Applicant: Inter-University Research Institute Corporation High Energy Accelerator Research Organization, Tsukuba-shi, Ibaraki (JP)

(72) Inventors: Ikuo Kurachi, Tsukuba (JP); Yasuo Arai, Tsukuba (JP); Miho Yamada, Tsukuba (JP)

(73) Assignees: INTER-UNIVERSITY RESEARCH INSTITUTE CORPORATION, Tsukuba-shi (JP); HIGH ENERGY ACCELERATION RESEARCH ORGANIZATION, Tsukuba-shi (JP)

(*) Notice: Subject to any disclaimer, the term of this patent is extended or adjusted under 35 U.S.C. 154(b) by 0 days.

(21) Appl. No.: 15/766,228

(22) PCT Filed: Oct. 6, 2016

(86) PCT No.: PCT/JP2016/079797
§ 371 (c)(1),
(2) Date: Apr. 5, 2018

(87) PCT Pub. No.: WO2017/061544
PCT Pub. Date: Apr. 13, 2017

(65) Prior Publication Data
US 2019/0131965 A1 May 2, 2019

Related U.S. Application Data

(60) Provisional application No. 62/312,804, filed on Mar. 24, 2016.

(30) Foreign Application Priority Data

Oct. 7, 2015 (JP) ................... 2015-199200

(51) Int. Cl.
*H03K 17/08* (2006.01)
*H03K 17/081* (2006.01)
(Continued)

(52) U.S. Cl.
CPC ... *H03K 17/08104* (2013.01); *H01L 27/1203* (2013.01); *H01L 29/786* (2013.01);
(Continued)

(58) Field of Classification Search
CPC .................. H03K 17/08; H03K 17/08104
See application file for complete search history.

(56) References Cited

U.S. PATENT DOCUMENTS

| 5,097,156 A * | 3/1992 | Shimabukuro | G06G 7/163 |
| | | | 327/357 |
| 6,600,241 B2 * | 7/2003 | Tichauer | H01L 27/092 |
| | | | 257/E27.062 |

(Continued)

FOREIGN PATENT DOCUMENTS

| JP | 2003-69031 A | 3/2003 |
| JP | 2005-79127 A | 3/2005 |

(Continued)

OTHER PUBLICATIONS

International Search Report dated Dec. 6, 2016, issued in counterpart International Application No. PCT/JP2016/079797 (3 pages, including cover sheet).

(Continued)

*Primary Examiner* — Hai L Nguyen
(74) *Attorney, Agent, or Firm* — Westerman, Hattori, Daniels & Adrian, LLP

(57) ABSTRACT

The present invention provides a radiation-damage-compensation-circuit and a SOI-MOSFET that has high radiation resistance. The SOI-MOSFET has the radiation-damage- (Continued)

compensation-circuit to recover the characteristics of the SOI-MOSFET after X-ray irradiation.

7 Claims, 16 Drawing Sheets

(51) Int. Cl.
   *H01L 29/786* (2006.01)
   *H01L 27/12* (2006.01)
   *H03K 19/003* (2006.01)
   H01L 27/088 (2006.01)
   H01L 21/8234 (2006.01)

(52) U.S. Cl.
   CPC . *H01L 29/78651* (2013.01); *H03K 19/00338* (2013.01); *H01L 21/823462* (2013.01); *H01L 27/088* (2013.01); *H03K 2017/0803* (2013.01)

(56) References Cited

U.S. PATENT DOCUMENTS

| | | | |
|---|---|---|---|
| 6,836,174 B1 * | 12/2004 | Chang | H03K 17/0822 |
| | | | 327/378 |
| 2003/0042543 A1 | 3/2003 | Hirano et al. | |
| 2008/0169518 A1 | 7/2008 | Clark et al. | |
| 2013/0043537 A1 | 2/2013 | Arai et al. | |

FOREIGN PATENT DOCUMENTS

| | | |
|---|---|---|
| JP | 2008-172238 A | 7/2008 |
| WO | 2011/111754 A1 | 9/2011 |

OTHER PUBLICATIONS

Written Opinion of the International Searching Authority dated Dec. 6, 2016, issued in counterpart International Application No. PCT/JP2016/079797 (4 pages, including cover sheet).

* cited by examiner

[Fig. 1]
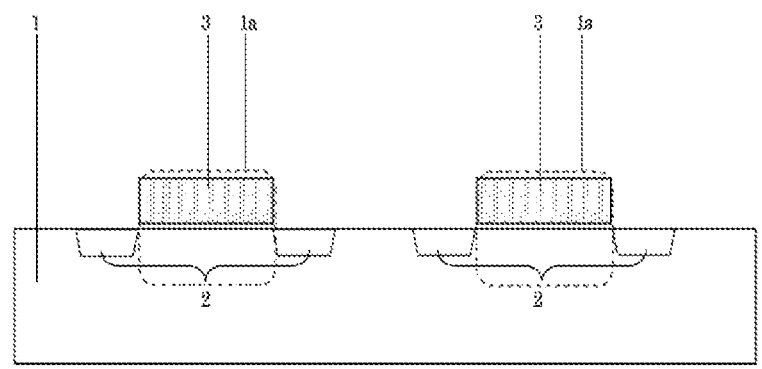

[Fig. 2]
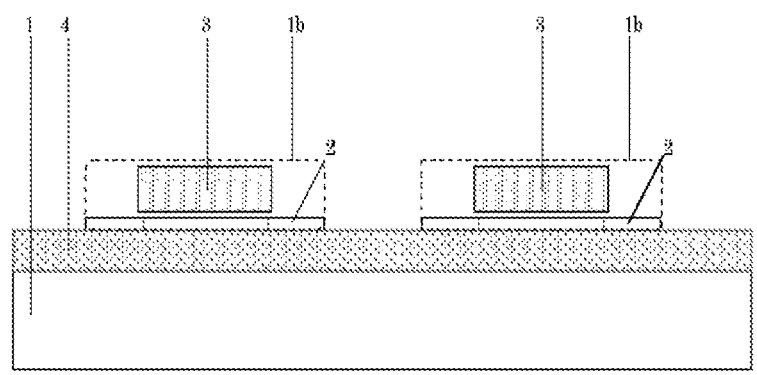

[Fig. 3]
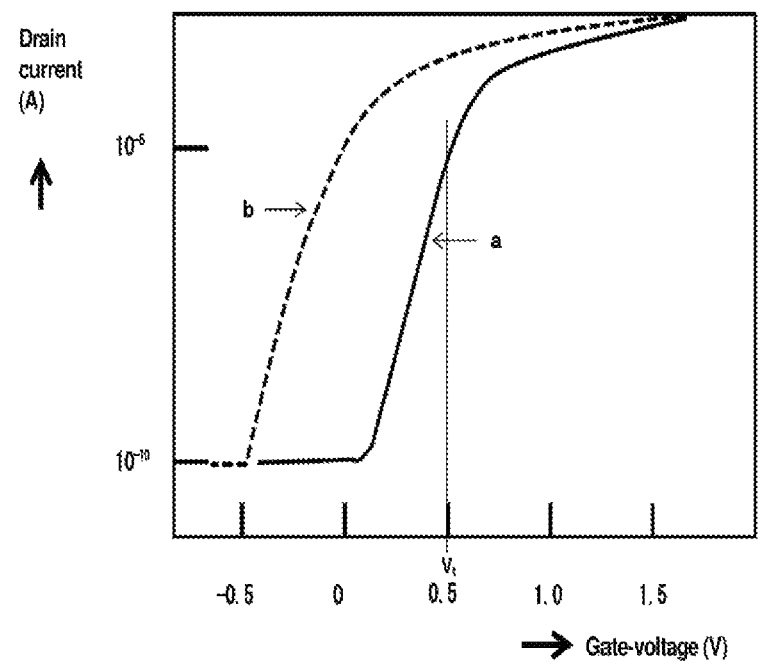

[Fig. 4]
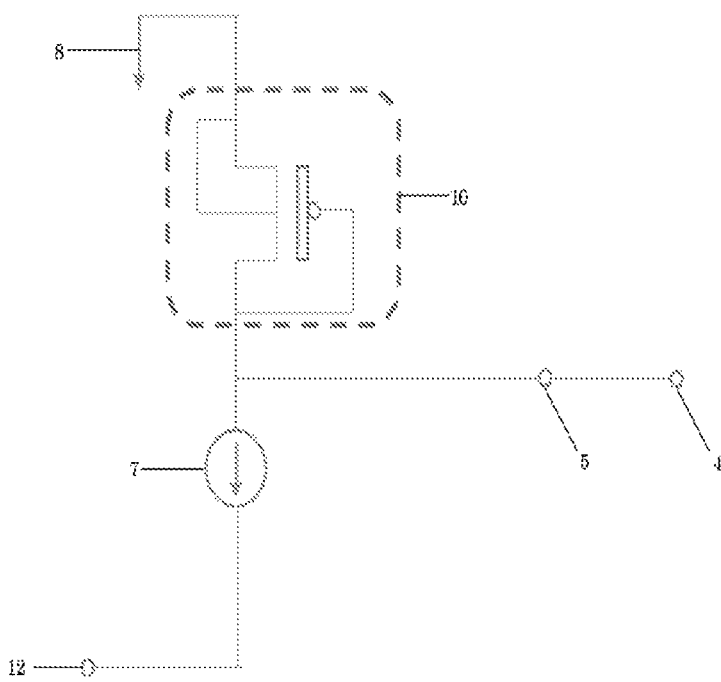

[Fig. 5]
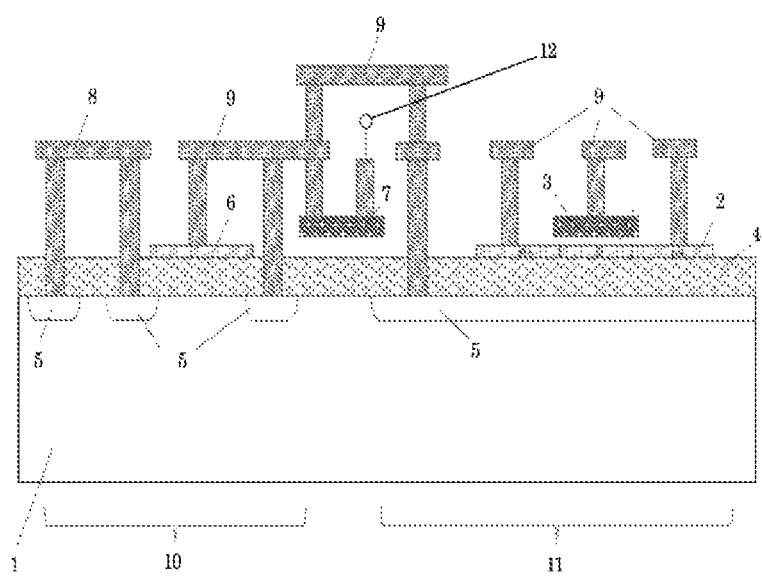

[Fig. 6]
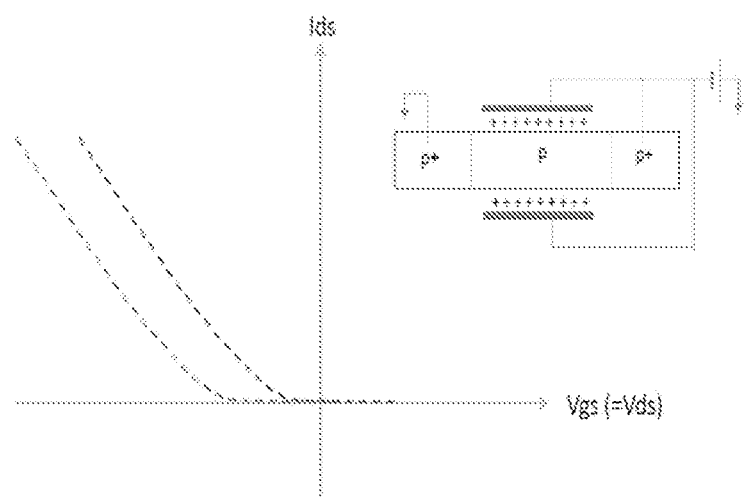

[Fig. 7]
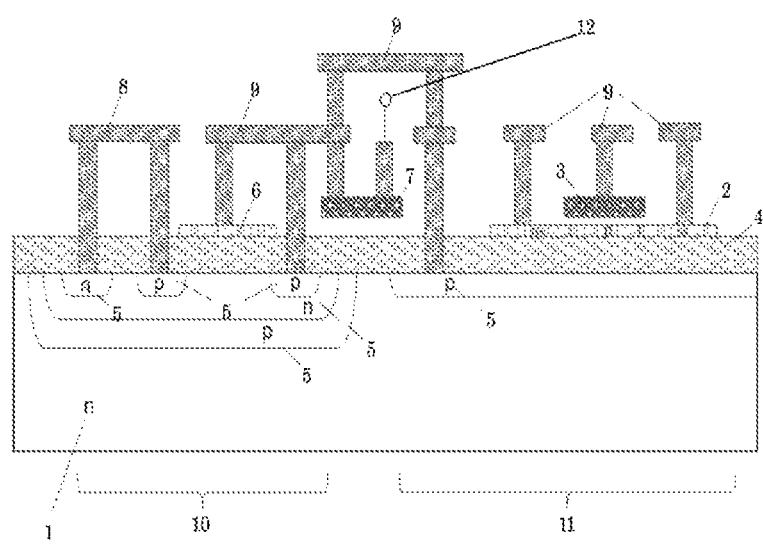

[Fig. 8]
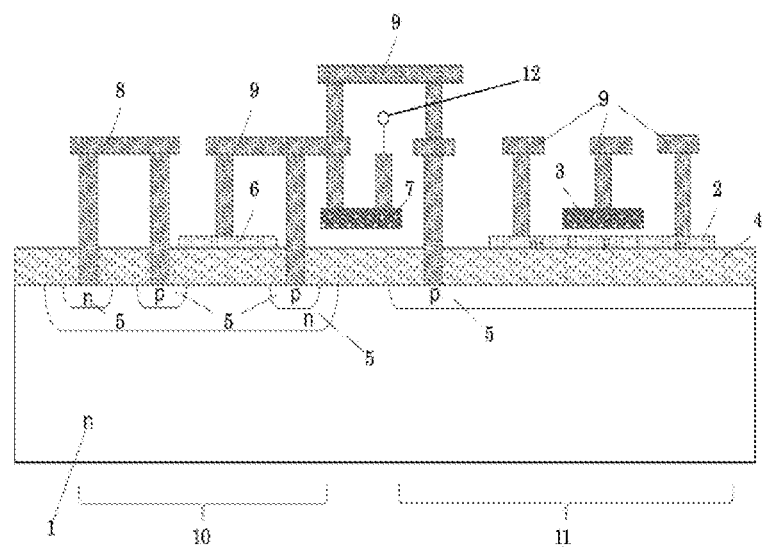

[Fig. 9]
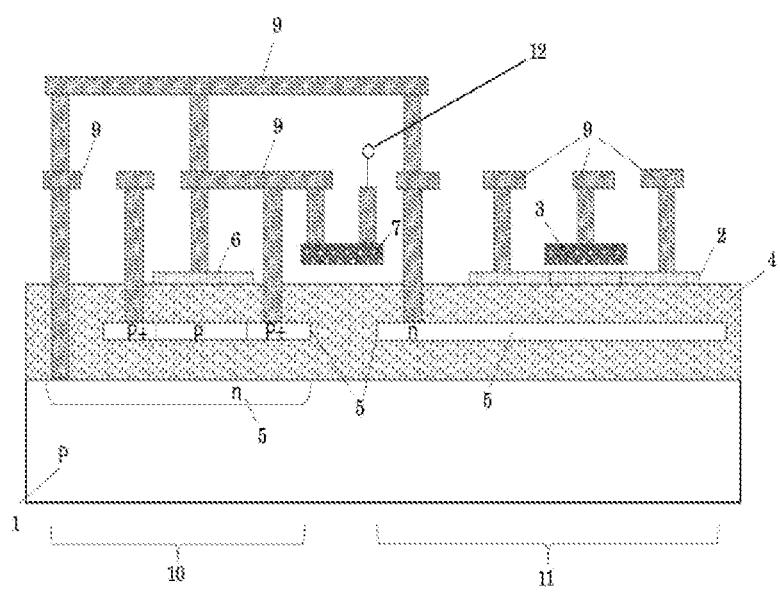

[Fig. 10]
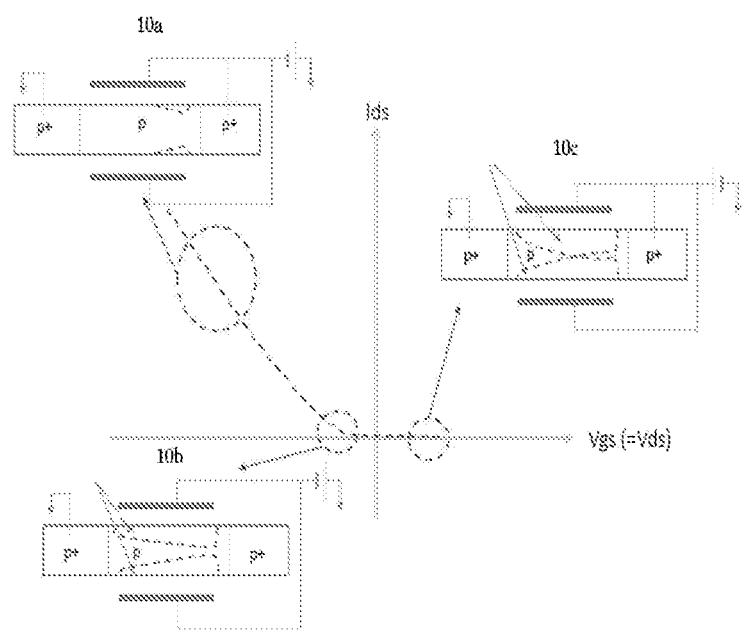

[Fig. 11]
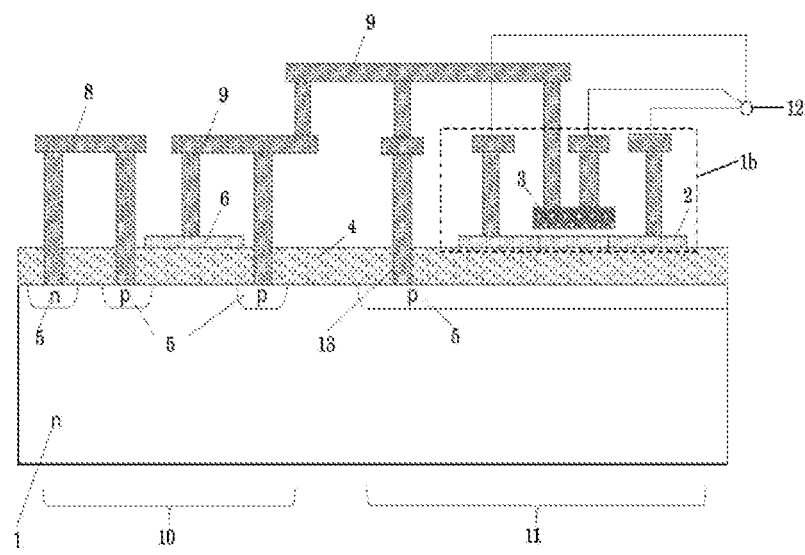

[Fig. 12]
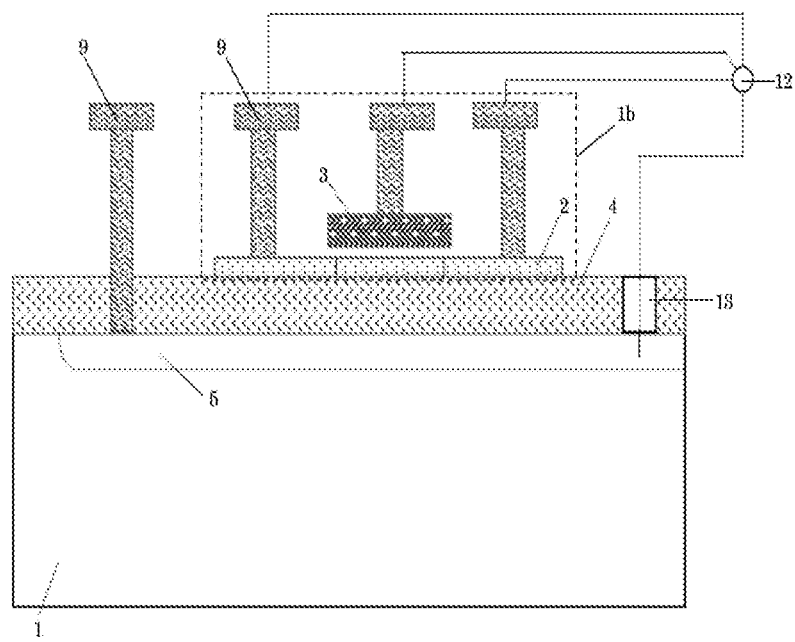

[Fig. 13]
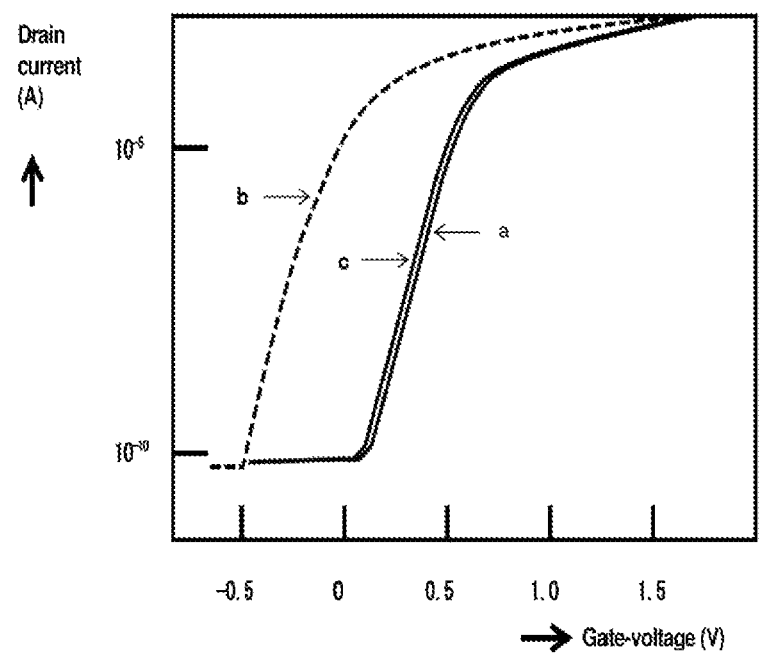

[Fig. 14]
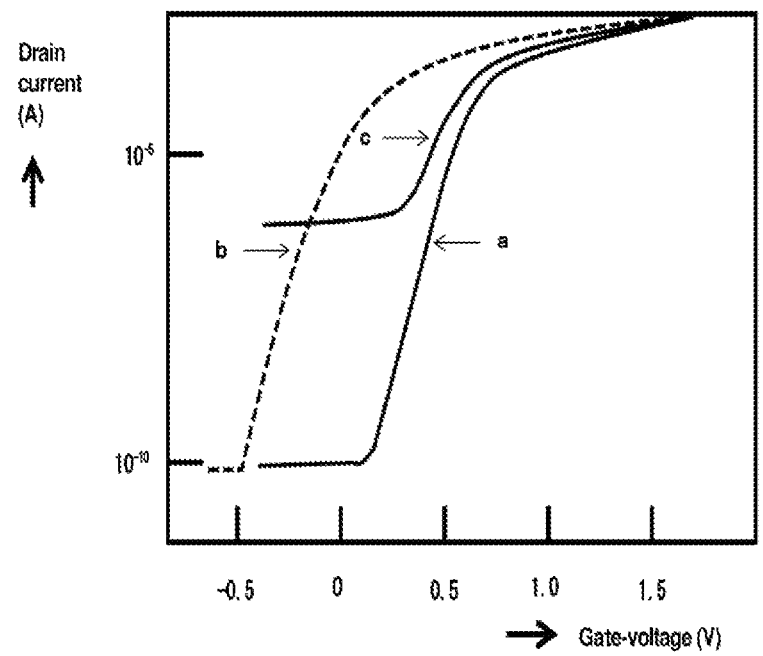

[Fig. 15]
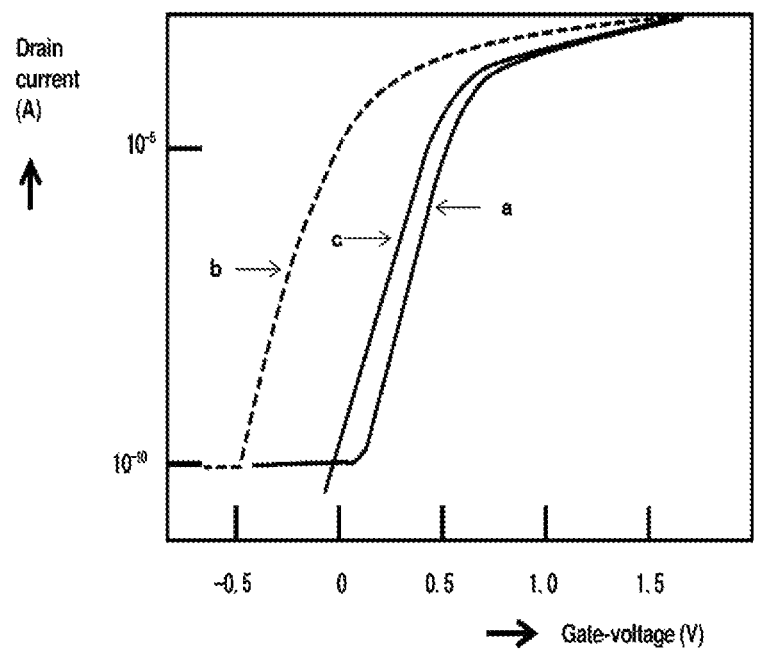

[Fig. 16]
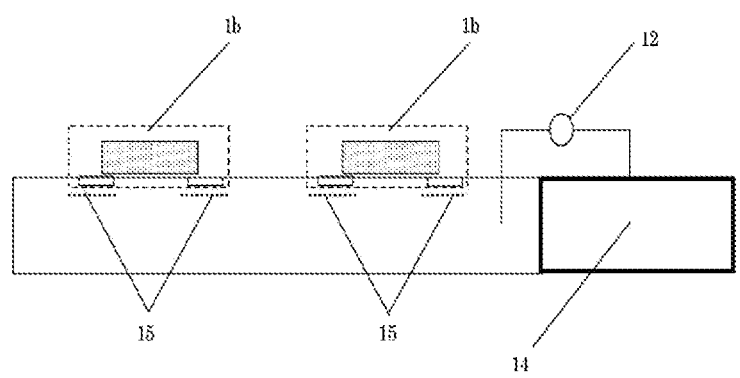

RADIATION-DAMAGE-COMPENSATION-CIRCUIT AND SOI-MOSFET

CROSS-REFERENCE

Cross-Reference to Related Applications

This application is based on and claims the benefit of priority of JP Application Serial No. 2015/199200, filed on Oct. 7, 2015 and U.S. Patent Application Ser. No. 62/312,804, filed on Mar. 24, 2016, the entire contents of which are incorporated herein by reference.

TECHNICAL FIELD

The present invention relates to a radiation-damage-compensation-circuit and a SOI-MOSFET that has high radiation resistance.

BACKGROUND ART

"SOI" is the same as "silicon-on-insulator". "MOSFET" is the same as "metal-oxide-semiconductor-field-effect-transistor". The conventional MOSFET has a structure in which a MOSFET is fabricated on a silicon-substrate, as shown in FIG. 1. The MOSFET comprises a source, gate and drain on the silicon-substrate (1). The gate (1a) consists of a channel, $SiO_2$-layer on the channel and gate-electrode (3) on the $SiO_2$-layer. An assembly of the source, channel and drain is called a silicon-membrane (2). An assembly of the source, gate and drain is called a transistor (1b). "SOI-MOSFET" means a MOSFET fabricated with the SOI. The conventional SOI-MOSFET has a structure in which a MOSFET is fabricated with the SOI, as shown in FIG. 2. "Depletion" means a state in which carriers such as electrons or positive holes are absent in the gate. "Partial depletion" means a state in which depletion is partial. "Complete depletion" means a state in which depletion is complete.

Positive charge is generated in the BOX when exposed with X-ray radiation. The SOI-MOSFET is less radiation-resistant against appreciable amounts of X-ray irradiation because radiation-induced positive charge in the BOX has ill effects on the transistor characteristics.

In order to solve the above problems, several methods which apply negative voltage to a bottom of the silicon-substrate, a back-gate, have been presented (Patent Literatures 1-3).

The Patent Literature 1 discloses a method for setting voltage applied to the back-gate as a function of radiation-exposition times. As shown in FIG. 2, the conventional SOI-MOSFET has a thick BOX (4) buried in a very thick silicon-substrate (1). For example, the silicon-substrate (1) is μm thick and the BOX (4) is sub-μm thick. This causes secondary problems: a very large voltage for long periods of time is required for canceling the positive charge in the BOX; discontinuous or non-constant radiation makes the performance of the SOI-transistor instable, due to overhigh or overlow voltage. The conventional SOI-MOSFET may be destroyed due to such a large voltage for long periods of time. However, the method disclosed by the Patent Literature 1 cannot resolve the above problems. The positive charge in the BOX cannot be removed with ease by applying voltage to the back-gate.

The Patent Literature 2 discloses a SOI-MOSFET that is capable of inhibiting leak-current independently with the gate-control. However, the SOI-MOSFET is essentially less resistant against radiation-exposure due to no method to cancel radiation-induced positive charge.

The Patent Literature 3 discloses the SOI-MOSFET that is capable of increasing or decreasing a threshold voltage by using high bias-substrate-coefficient on stand-by or line.

The present invention differs from the Patent Literatures 1-3 in respect to the structure and function with each other, as follows.

1) The SOI-MOSFET disclosed in the Patent Literature 1 has no system to detect the radiation-induced positive charge. Contrary, the present invention has a structure that detects a voltage threshold shift due to the radiation-induced positive charge followed by application of voltage to cancel the radiation-induced positive charge.

2) The SOI-MOSFET disclosed in the Patent Literature 2 has a well-in-well including a p-well and a n-well. Contrary, the present invention has any one of p-well or n-well but does not have the both.

3) The SOI-MOSFET disclosed in the Patent Literature 2 installs a circuit connecting the well-in-well and the back-gate in order to inhibit leak-current in the gate of the MOSFET. Contrary, the present invention mounts a circuit connecting a gate, a voltage-source and a via that penetrates the BOX to lead a buried p-well, wherein a voltage of the voltage-source is applied to the buried p-well, negative electron of the buried p-well generates, electron-tunneling to the BOX takes place, and positive charge in the BOX is canceled with the negative electron.

4) The SOI-MOSFET disclosed in the Patent-Literature 3 is able to increase a threshold voltage but is not able to detect a voltage threshold shift. Contrary, the present invention has a structure that detects a voltage threshold shift due to the radiation-induced positive charge followed by application of voltage to cancel the radiation-induced positive charge.

CITATION LIST

Patent Literature

[Patent Literature 1] JP-A-2003-69031
[Patent Literature 2] WO-A-2011-111754
[Patent Literature 3] JP-A-2005-79127

SUMMARY OF INVENTION

As explained above, the conventional SOI-MOSFET cannot recover radiation damage by applying voltage to the back-gate, therefore, makes often malfunctions due to radiation-induced positive charge.

Technical Problem

An object of the present invention is, in view of the above described circumstances, to provide new radiation-damage-compensation-circuit and SOI-MOSFET that has high radiation-resistance.

Solution to Problem

The present invention provides a radiation-damage-compensation-circuit and a SOI-MOSFET that has a radiation-damage compensation-circuit generating enough negative voltage to cancel radiation-induced positive charge.

Advantageous Effects of the Invention

The present invention is able to detect a voltage threshold shift due to the radiation-induced positive charge and apply enough negative voltage to cancel the radiation-induced positive charge to the buried p-well through the radiation-damage compensation-circuit, therefore, is able to work stably semiconductor-devices such as an aerospace device and an X-ray-imaging sensor using the SOI-MOSFET even when meets with high dose or non-steady radiation with an application of adequate voltage. Under radiation, the radiation-induced positive charge is drown in the direction due to minus voltage applied on the buried p-well and resultantly characteristics of the SOI-MOSFET are few changed. Another is able to cancel radiation-induced positive charge in the BOX with the Fowler-Nordheim tunneling electron applied to the buried p-well through the radiation-damage compensation-circuit, therefore, is able to recover the characteristics of the SOI-MOSFET after the irradiation by applying a voltage of 5 MV/cm~10 MV/cm for several seconds or several minutes to the buried p-well.

BRIEF DESCRIPTION OF DRAWINGS

FIG. 1 shows a structure of the conventional MOSFET.
FIG. 2 shows the conventional SOI-MOSFET.
FIG. 3 shows the characteristics of the conventional SOI-MOSFET before and after X-ray irradiation.
FIG. 4 shows a radiation-damage-compensation-circuit.
FIG. 5 shows a structure of the SOI-MOSFET (A).
FIG. 6 shows the characteristics of the SOI-MOSFET (A) before and after X-ray irradiation.
FIG. 7 shows a structure of the SOI-MOSFET (B).
FIG. 8 shows a structure of the SOI-MOSFET (C).
FIG. 9 shows a structure of the SOI-MOSFET (D).
FIG. 10 shows a working mechanism of the MOSFET (D).
FIG. 11 shows a structure of the SOI-MOSFET (E).
FIG. 12 shows a structure of the SOI-MOSFET (F).
FIG. 13 shows the characteristics of the SOI-MOSFET (F) before and after X-ray irradiation.
FIG. 14 shows the characteristics of the SOI-MOSFET with complete depletion before and after X-ray radiation.
FIG. 15 shows the characteristics of the SOI-MOSFET with complete depletion before and after reapplication of voltage.
FIG. 16 shows an application of the radiation-damage-compensation-circuit on a semiconductor device.

DESCRIPTION OF EMBODIMENTS

Other objects, features and advantages of the invention will become apparent from the following description of the embodiments of the invention taken in conjunction with accompanying drawings. Hereinafter, the present invention will be specially explained as an execution embodiment using the following drawings. It should be further understood by those skilled in the art that although the foregoing description has been made on embodiments of the invention, the invention is not limited thereto and various changes and modifications may be made without departing from the spirit of the invention and the scope of the appended claims.

Reference 1

FIG. 1 shows the conventional MOSFET. The conventional MOSFET comprises a silicon-substrate (1), a silicon-membrane (2) and a gate-electrode (3) on the silicon-substrate (1), as shown in FIG. 1. The silicone-membrane (2) comprises a source, a channel and a drain. The conventional MOSFET has no BOX, therefore, has no system to cancel radiation-induced positive charges.

Reference 2

FIG. 2 shows the conventional SOI-MOSFET. The conventional SOI-MOSFET comprises a silicon-substrate (1), BOX (4) above the silicon-substrate (1) and the silicon-membrane (2) and gate-electrode (3) above the silicon-membrane (2), as shown in FIG. 2. The conventional SOI-MOSFET has no system to cancel radiation-induced positive charge, therefore, is not available for an X-ray imaging sensor under X-ray irradiation Control 1

The conventional SOI-MOSFET is irradiated with X-ray of 250 Gy. Radiation-damage of the SOI-MOSFET characteristics after the X-ray-irradiation can be evaluated with a behavior of gate-voltage vs. drain-current before and after the X-ray irradiation. The result is shown in FIG. 3. Generally, a threshold of the gate-voltage Vt is shifted to a lower voltage side after the irradiation. Before the irradiation, a threshold of a gate-voltage Vt is about 0.5 V (see curve-a). After the irradiation, the Vt is shifted to about −0.5 V (see curve-b).

Example 1

FIG. 4 shows a radiation-damage-compensation-circuit that is fabricated with a MOSFET. The radiation-damage-compensation-circuit comprises a MOSFET-channel (10) to detect a voltage threshold shift due to a radiation-induced positive charge in the BOX (4), a path generating an external voltage under a control of the MOSFET-channel (10), a path applying a negative voltage corresponding to the voltage threshold shift to a current-source (7), a buried p-well (5) below the BOX (4), a path applying a negative charge of the current-source to the buried p-well (5) and a path diffusing the negative charge to the BOX (4). In this way, the radiation-damage compensation-circuit is able to cancel the radiation-induced positive charge with monitoring an amount of radiation-induced positive charge. The applied source voltage depends on the thickness of the BOX. When the BOX is thick, comparatively higher voltage is required. When the BOX is thin, comparatively lower voltage is required. Even when the BOX is thick, an application of high voltage is allowed because the buried p-well (5) is in the silicon-substrate (1). The current-source (7) may be replaced with electric resistance (7), which is a more convenient circuit.

All of the following SOI-MOSFET according to the present invention has the above radiation-damage compensation-circuit.

FIG. 5 shows a SOI-MOSFET having the radiation-damage compensation-circuit connecting the MOSFET-channel (10), an external voltage-source (12), a silicon-diffusion-layer (7), the buried p-well (5), the BOX (4). The MOSFET-channel (10) comprises a set of the n-well (5), the p-well (5) and the silicon-layer (6) that is fabricated with the SOI-MOSFET and connected with a wire (8) as detecting the voltage threshold shift due to the radiation-induced positive charge in the BOX (4). The wire (8) leads to the ground. Here, an assembly of the silicon-substrate (1), buried p-well (5), silicon-layer (6), ground (8) and connecting wire (9) corresponds to the SOI-MOSFET channel (10) in FIG. 4 and the silicon-diffusion-layer (7) corresponds to the current-source (7) in FIG. 4. A polysilicon may be used for the silicon diffusion-layer (7). In FIG. 5, the silicon-substrate (1) is, for example, a n-type one. The buried p-well (5) is formed by doping a dopant such as boron of the III-family which has an opposite polarity to the n-type.

FIG. 6 shows the characteristics of the SOI-MOSFET (A) before and after the irradiation. A threshold Vt before the irradiation is about 0 V. After the irradiation, the V t is shifted to a negative side. This shift is corresponding to the contribution of the radiation-induced positive charge. The radiation-induced positive charge is canceled by applying negative voltage corresponding to the threshold sift to the buried p-well. Experi-mentally, when a BOX is 200 nm thick and the irradiation is ~100 kGy, the Vt is in the range −10~−15 V. Therefore, application of −15 V of the voltage source (12) to the buried p-well (5) performs complete recovery of the SOI-MOSFET characteristics.

Example 2

FIG. 7 shows the SOI-MOSFET (B). The SOI-MOSFET (B) has an n-type as the silicon-substrate (1) and a well-in-well, the buried n- and p-wells (5) in the buried n-well (5) which is buried in the buried p-well (5). Therefore, it is not required to anchor the silicon-substrate (1) to the ground.

Example 3

FIG. 8 shows the SOI-MOSFET (C). The SOI-MOSFET (C) is a p-type in which the silicon-substrate (1) is a p-type, the buried n-well (5) is in the p-typed silicon-substrate (5), the buried p-well (5) as a source and the buried n-well (5) as a drain are together in the buried n-well (5).

Example 4

In recently years, a double SOI-MOSFET that has a structure in which an additional silicon-diffusion-layer is formed in the BOX has been presented (the Patent Literature 2). The double SOI-MOSFET is able to use the additional silicon-diffusion-layer as an electrode for shielding the top silicon-diffusion-layer and the under silicon-substrate, therefore, is able to suppress the crosstalk between the top silicon-diffusion-layer and the under silicon-substrate. However, the double SOI-MOSFET does not have good radiation-resistance as with the conventional SOI-MOSFET. Because, the radiation-induced positive charge is generated in the BOX including the middle silicon-diffusion-layer. To solve the problem, the SOI-MOSFET (D) as shown in FIG. 9 will be presented. The SOI-MOSFET (D) has a structure in which the middle silicon diffusion-layer (5) is formed inside the BOX, the middle silicon diffusion-layer is a [p+−p−p+] type, the buried n-well (5) is formed under the BOX, and the silicon-substrate (1) is a p-type. The top silicon diffusion-layer (6) and the middle buried n-well (5) in the BOX are together available as a gate-electrode. When using an n-typed silicon-substrate, the middle silicon diffusion layer (5) has to be a [n+−n−n+] type. The top silicon diffusion layer (6) and the middle silicon diffusion layer (5) are connected together with wires (9) through electric contact, working as a single gate. Therefore, the SOI-MOSFET (D) is able to detect the radiation-induced positive charge.

FIG. 10 shows a working mechanism of the SOI-MOSFET (D).

10a: when the gate and the drain are diode-contacted with wires and a drain-voltage and a gate-voltage are together positive, upper and under parts of the channel are lying in the depletion state due to the field-effect. There is no current between the source and the drain, an off-state.

10b: when the gate-voltage and the drain-voltage are together minus voltage, the depletion state of the channel turns back due to the field-effect of the gate, followed by appearance of a semiconducting region with non-depletion state. A current passes from the drain to the source, an on-state.

10c: In the on-state, the channel merely works as a semiconducting resistance. Comparatively high voltage can be applied to even a thin silicon-diffusion-layer.

The SOI-MOSFET (D) before and after the irradiation shows a behavior of gate-voltage vs. drain-current similar to that in FIG. 6. After the irradiation, the $V_t$ is shifted to a minus voltage side. By applying voltage corresponding to a shift of the $V_t$ to the middle silicon-diffusion layer in the BOX, the characteristics of the SOI-MOSFET (D) after the irradiation can be recovered.

Example 5

FIG. 11 shows a SOI-MOSFET (E) having the radiation-damage compensation-circuit connecting the MOSFET-channel (10), a transistor (1b), an external voltage-source, a via (13), the buried p-well (5), the BOX (4). The via (13), that is placed in the BOX (4) as penetrating the BOX (4), is a device connecting the gate and the p-well (5). After X-ray irradiation, a voltage of the external voltage-source (12) controlled by the MOSFET-channel (10) is applied to the gate, applied to the buried p-well (5) through the via (13), negative electron of the buried p-well diffuses in the BOX (4) and the negative electron cancels the radiation-induced positive charge. The buried p-well (5) of the SOI-MOSFET (E) may be replaced with a buried n-well.

Example 6

The SOI-MOSFET with partial depression may be used for. A thickness of the SOI-membrane (2) is usually 100 nm or more.

Example 7

The SOI-MOSFET with complete depression may be used for. A thickness of the SOI-membrane (2) is usually 100 nm or less.

Example 8

FIG. 12 shows a SOI-MOSFET (F) having the radiation-damage compensation-circuit connecting a transistor, an external voltage-source, a via, the buried p-well, the BOX. After the X-ray irradiation, a voltage of the external voltage-source (12) controlled by the transistor (1b) is applied to the buried p-well (5) through the via (13), negative electron of the buried p-well diffuses in the BOX (4) and the negative electron cancels the radiation-induced positive charge. Here, an external detector connected with a wire (9) is capable of detecting the voltage threshold sift due to the radiation-induced positive charge in the BOX in a similar way as the MOSFET-channel. The via (13) may be replaced with a wire leading to the buried p-well (5).

Example 9

FIG. 13 shows the characteristics of the SOI-MOSFET (F) before and after the X-ray-irradiation of 250 Gy. A voltage of 140 V (7 MV/cm) is applied for 3 seconds. It is found that the characteristics are completely recovered to the same (curve-c) as the original state (curve-a) before irradiation by applying the voltage.

Example 10

FIG. 14 shows the characteristics of the SOI-MOSFET with complete depletion before and after the X-ray-irradiation of 250 Gy. A voltage of 140 V is applied for 3 seconds. It is found that the characteristics are completely recovered to the same (curve-c) as the original state (curve-a) before the irradiation by applying the voltage, except for an increase of drain-current. The curve-c is a peculiar behavior of the SOI-MOSFET with complete depletion.

Example 11

FIG. 15 shows the characteristics of the SOI-MOSFET with complete depletion before and after the X-ray-irradiation of 250 Gy. A voltage of 140 V is applied for 3 seconds, successively a voltage of −140 V for 3 seconds. It is found that the characteristics are completely recovered to the same (curve-c) as the original state (curve-a) before irradiation by applying the voltage, except for an increase of drain-current.

Example 12

The SOI-MOSFET having the buried n-well instead of the buried p-well shows the same behavior as those of the SOI-MOSFET.

Example 13

FIG. 16 shows a semiconductor-device that has the radiation-damage compensation-circuit (14). Due to X-ray, the semiconductor-device tends to accumulate the radiation-induced positive charge at the beneath (15) of their transistor (1b). The radiation-damage compensation-circuit (14) detects a voltage threshold shift due to the above charge and cancels the charge by applying an external voltage on the beneath (15).

INDUSTRIAL APPLICABILITY

The present invention relates to the radiation-damage-compensation-circuit, the SOI-MOSFET with high radiation-resistance and the semiconductor devices requiring the radiation-resistance such as an aerospace device and an X-ray imaging sensor. Therefore, the present invention is available for many radiation-resistant applications.

REFERENCE SIGNS LIST 1a gate
1b transistor
1 silicon-substrate
2 silicon-membrane
3 gate-electrode
4 BOX
5 buried p-well or buried n-well
6 silicon layer
7 current-source (silicon diffusion-layer)
8 wire leading to the ground
9 wire
10 MOSFET (MOSFET-channel)
11 SOI-MOSFET
12 external voltage source
13 via
14 radiation-damage-compensation-circuit
15 beneath of a transistor

The invention claimed is:

1. A radiation-damage-compensation-circuit fabricated with a SOI-MOSFET, comprising: a MOSFET-channel to detect a voltage threshold shift due to a radiation-induced positive charge in the BOX; a path generating an external voltage under a control of the MOSFET-channel, applying a negative voltage corresponding to the voltage threshold shift to a current-source and applying a negative charge of the current-source to a buried p-well below the BOX.

2. A SOI-MOSFET, having the radiation-damage-compensation-circuit according to claim 1, connecting the MOSFET-channel, an external voltage-source, a silicon-diffusion-layer, the buried p-well and the BOX.

3. A SOI-MOSFET, having the radiation-damage-compensation-circuit according to claim 1, connecting the MOSFET-channel, a transistor, an external voltage-source, a via, the buried p-well and the BOX.

4. A SOI-MOSFET, having the radiation-damage-compensation-circuit according to claim 1, connecting a transistor, an external voltage-source, a via, the buried p-well and the BOX.

5. The SOI-MOSFET according to claim 2, having a buried n-well replaced with the buried p-well.

6. The SOI-MOSFET according to claim 2, having a partially or completely depletion.

7. The radiation-damage-compensation-circuit according to claim 1, for use to cancel a radiation-induced positive charge of a semiconductor-device requiring radiation resistance, said radiation-damage-compensation-circuit being able to cancel the radiation-induced-positive-charge by applying an external voltage on the beneath of a transistor of the semiconductor-device.

* * * * *